US012272034B2

(12) United States Patent
Agarwal et al.

(10) Patent No.: US 12,272,034 B2
(45) Date of Patent: Apr. 8, 2025

(54) SYSTEMS AND METHODS FOR BACKGROUND AWARE RECONSTRUCTION USING DEEP LEARNING

(71) Applicant: GE Precision Healthcare LLC, Wauwatosa, WI (US)

(72) Inventors: Apoorva Agarwal, Bangalore (IN); Jignesh Dholakia, Bangalore (IN); Dheeraj Kulkarni, Bangalore (IN); Deepthi S., Bangalore (IN)

(73) Assignee: GE Precision Healthcare LLC, Waukesha, WI (US)

( * ) Notice: Subject to any disclaimer, the term of this patent is extended or adjusted under 35 U.S.C. 154(b) by 448 days.

(21) Appl. No.: 17/211,511

(22) Filed: Mar. 24, 2021

(65) Prior Publication Data

US 2021/0319539 A1 Oct. 14, 2021

(30) Foreign Application Priority Data

Apr. 13, 2020 (IN) .............................. 202041015864

(51) Int. Cl.
*G06T 5/75* (2024.01)
*G06N 3/08* (2023.01)
(Continued)

(52) U.S. Cl.
CPC ................ *G06T 5/75* (2024.01); *G06N 3/08* (2013.01); *G06N 20/00* (2019.01); *G06T 5/50* (2013.01);
(Continued)

(58) Field of Classification Search
CPC ......... G06T 5/004; G06T 5/50; G06T 7/0012; G06T 7/194; G06T 2207/10081;
(Continued)

(56) References Cited

U.S. PATENT DOCUMENTS

| 10,186,038 B1 * | 1/2019 | Kluckner ................. G06T 7/70 |
| 2017/0049355 A1 * | 2/2017 | Furudate .............. A61B 5/0044 |

(Continued)

FOREIGN PATENT DOCUMENTS

| CN | 105574859 A | * | 5/2016 | |
| CN | 109087318 A | * | 12/2018 | ........... G06N 3/0454 |
| WO | WO-2018229490 A1 | * | 12/2018 | ........... G06N 3/0454 |

OTHER PUBLICATIONS

Milletari et al, Hough-CNN: Deep learning for segmentation of deep brain regions in MRI and ultrasound, Computer Vision and Image Understanding, 164 (2017) 92-102. (Year: 2017).*

(Continued)

*Primary Examiner* — Kathleen M Broughton
(74) *Attorney, Agent, or Firm* — Fletcher Yoder, P.C.

(57) ABSTRACT

Method (1000) and system (100) for image processing for a medical device is provided. The method (1000) includes acquiring (1010) a plurality of images of a subject using an image acquisition system (110) of the medical device. The method (1000) further includes identifying and differentiating (1020) a plurality of background pixels and a plurality of foreground pixels in the images using the deep learning module (125). The method (1000) further includes suppressing (1030) the identified background pixels using a mask and processing the foreground pixels for subsequent reconstruction and/or visualization tasks.

13 Claims, 13 Drawing Sheets

(51) Int. Cl.
*G06N 20/00* (2019.01)
*G06T 5/50* (2006.01)
*G06T 7/00* (2017.01)
*G06T 7/194* (2017.01)

(52) U.S. Cl.
CPC ............ *G06T 7/0012* (2013.01); *G06T 7/194* (2017.01); *G06T 2207/10081* (2013.01); *G06T 2207/10088* (2013.01); *G06T 2207/10108* (2013.01); *G06T 2207/10116* (2013.01); *G06T 2207/10132* (2013.01)

(58) Field of Classification Search
CPC . G06T 2207/10088; G06T 2207/10108; G06T 2207/10116; G06T 2207/10132; G06N 3/08; G06N 20/00; G06N 3/045; G06N 3/084; G06V 2201/03; G06V 10/273; G06V 10/454; G06V 10/82; G01R 33/5608
See application file for complete search history.

(56) References Cited

U.S. PATENT DOCUMENTS

| | | | |
|---|---|---|---|
| 2017/0109881 A1* | 4/2017 | Avendi | G06T 7/11 |
| 2017/0258433 A1* | 9/2017 | Gulsun | A61B 6/5217 |
| 2018/0218497 A1* | 8/2018 | Golden | G06T 7/136 |
| 2018/0315188 A1* | 11/2018 | Tegzes | G06T 7/11 |
| 2018/0350078 A1* | 12/2018 | Sun | G06T 7/0012 |
| 2018/0374209 A1* | 12/2018 | Patil | G06N 3/084 |
| 2019/0015059 A1* | 1/2019 | Itu | A61B 6/025 |
| 2019/0026896 A1* | 1/2019 | Kluckner | G06T 7/70 |
| 2019/0328348 A1* | 10/2019 | De Man | G06T 5/20 |
| 2020/0085382 A1* | 3/2020 | Taerum | G06T 7/0016 |
| 2020/0090340 A1* | 3/2020 | Cheluvaraju | G06T 7/50 |
| 2022/0230310 A1* | 7/2022 | Xie | G06T 7/174 |
| 2023/0033442 A1* | 2/2023 | Xiang | G06N 3/044 |

OTHER PUBLICATIONS

Ebner et al, Automated framework for localization, segmentation and super-resolution reconstruction of fetal brain MRI, 2020, NeuroImage 206 116324, pp. 1-17. (Year: 2020).*

Hatamizadeh et al., "End-to-End Boundary Aware Networks for Medical Image Segmentation," https://arxiv.org/pdf/1908.08071, Sep. 10, 2019, 8 pages.

Rameesa et al., "A Simple and Robust Strategy for Background Removal from Brain MR Images," https://iopscience.iop.org/article/10.1088/1757-899X/396/1/012039/pdf, 2018, 6 pages.

Sundaran et al., "Optimal Windowing of MR Images using Deep Learning: An Enabler for Enhanced Visualization," https://arxiv.org/pdf/1908.00822, Aug. 2, 2019, 4 pages.

* cited by examiner

SYSTEMS AND METHODS FOR BACKGROUND AWARE RECONSTRUCTION USING DEEP LEARNING

CROSS REFERENCE

The present application claims priority and benefit of Indian Patent Application No. 202041015864 filed on Apr. 13, 2020, which in incorporated herein by reference in its entirety.

FIELD OF THE INVENTION

This disclosure relates generally to improved imaging systems and methods, more particularly, to a method for background aware reconstruction using deep learning.

BACKGROUND OF THE INVENTION

Magnetic resonance imaging (MRI) is a medical imaging technique used in the field of radiology to generate detailed three-dimensional images of a subject such as human body. Images obtained using magnetic resonance imaging (MRI) systems require further processing to generate a final image with improved quality. A typical anatomical MRI scan may have up to 40% of the area covered by background pixels which does not have any clinically relevant information. Various kind of scans generate different levels of noise in the background due to various factors like physics involved, ambience and scanner characteristics to name a few. Therefore, presence of noise makes the reading and post processing of the images challenging.

Also, image reconstruction is an iterative process to get readable image from the scan space data. In case of MR this scan space is called k-space or frequency space. Image reconstruction employs different filters before and after getting the first version of image from a non-image space data to reduce the noise in image. These filters also need to process clinically irrelevant background pixels. Not only this leads to enhancing the noise pixels, but also spending precious scanner time in processing unwanted pixels. Current efforts on reducing/eliminating background are either anatomy/contrast specific or they have their own limitations.

Localizer images or scout images are typically used in magnetic resonance imaging (MRI) to determine the scan position and extent of the subsequent scans. These are low resolution, larger field of view images.

In magnetic resonance imaging (MRI), the background region may be noisy and exhibits strong intensity inhomogeneity. This significant presence of background noise increases with enhanced contrast, which may or may not be removed completely using denoising techniques available during magnetic resonance imaging (MRI) image reconstruction pipeline. Presence of background noise negatively affects subsequent processing, such as impact on image filtering operations in the reconstruction pipeline or outside the reconstruction pipeline, biases in computing window width, window values stored in Digital Imaging and Communications in Medicine (DICOM), noisy functional maps, sub-optimal output for whole-body imaging solutions and variations in output/visualization from software that dynamically compute Window Width/Window Level. Attempt to remove this background noise using classic thresholding creates gaps in the anatomical regions since intensity ranges of noise (background) and anatomy (foreground) are not entirely exclusive.

Also, during the reconstruction pipeline, a considerable amount of time is spent in computing and enhancing clinically irrelevant background pixels. Therefore, identifying the background pixels early in the reconstruction pipeline or iteration, setting their values to zero and not processing them forward will not only help generate better quality images but will also help save computation time spent on processing clinically irrelevant information.

BRIEF DESCRIPTION OF THE INVENTION

In accordance with one aspect of the disclosure a method for background aware image reconstruction for a medical device such as magnetic resonance imaging (MRI) system is provided. The method comprises receiving via a deep learning module a plurality of images of a subject acquired using an image acquisition system of the medical device. The method further comprises identifying a plurality of background pixels and a plurality of foreground pixels in the image using a deep learning module. The method further comprises suppressing the identified background pixels and processing only the foreground pixels in subsequent steps of image reconstruction or for visualization/post processing.

In accordance with another aspect of the disclosure a system for background aware image reconstruction for a medical device such as magnetic resonance imaging (MRI) system is provided. The system comprises an image acquisition system of a medical device configured to acquire a plurality of images of the subject. The system further comprises an image reconstruction module connected with image acquisition system and configured to generate display/read quality images. The system further comprises a deep learning module connected to image reconstruction module and configured to receive plurality of images from image reconstruction module and identify plurality of background pixels and a plurality of foreground in the image. Image reconstruction module is further configured to use information generated from deep learning module to process only the foreground pixels in subsequent steps and store them for visualization/postprocessing.

BRIEF DESCRIPTION OF THE DRAWINGS

FIG. 4 illustrates an example Image Acquisition, reconstruction and postprocessing system wherein mask generated during the reconstruction of the localizer image is used for suppressing the background during the reconstruction of localizer images as well as during the reconstruction of images scanned after that.

FIG. 5 illustrates an example Image Acquisition, reconstruction and postprocessing system wherein mask generated from reconstructed DICOM images of the localizer is used for suppressing the background in the reconstructed localizer images as well as for suppressing background during the reconstruction of images scanned after that.

DETAILED DESCRIPTION

Figure 1A:
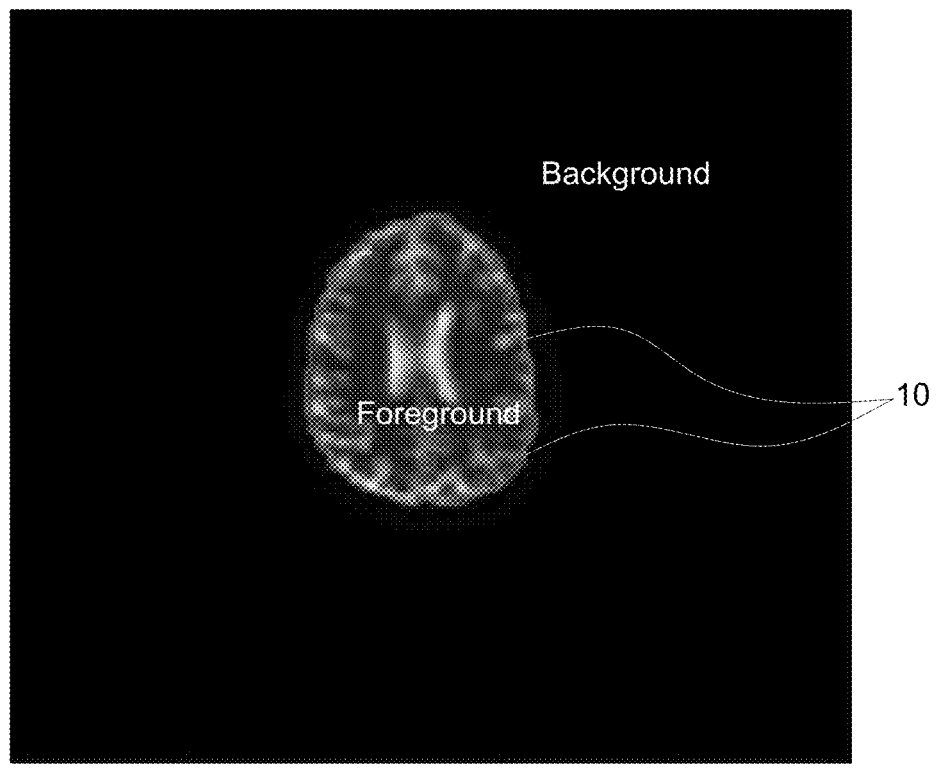
FIGS. 1(a)-1(b) illustrate images of brain and abdomen obtained using a magnetic resonance imaging (MRI) system and the separation of foreground (anatomy) and background (non-anatomical regions) in them as meant in this disclosure.

In the following specification and the claims, reference will be made to a number of terms, which shall be defined to have the following meanings.

The singular forms "a", "an", and "the" include plural references unless the context clearly dictates otherwise.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As used herein, the terms "software" and "firmware" are interchangeable, and include any computer program stored in memory for execution by devices that include, without limitation, mobile devices, clusters, personal computers, workstations, clients, and servers.

As used herein, the term "computer" and related terms, e.g., "computing device", "processor", "controller" are not limited to integrated circuits referred to in the art as a computer, but broadly refers to at least one microcontroller, microcomputer, programmable logic controller (PLC), application specific integrated circuit, and other programmable circuits, and these terms are used interchangeably herein.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In accordance with one aspect of the disclosure a method for background aware image reconstruction for a medical device such as magnetic resonance imaging (MRI) system is provided. The method comprises acquiring a plurality of images using an image acquisition system of the medical device. The method further comprises identifying and differentiating a plurality of background pixels and a plurality of foreground pixels in the images using a deep learning module. The method further comprises suppressing the identified background pixels and processing the foreground pixels for visualization.

Figure 1B:
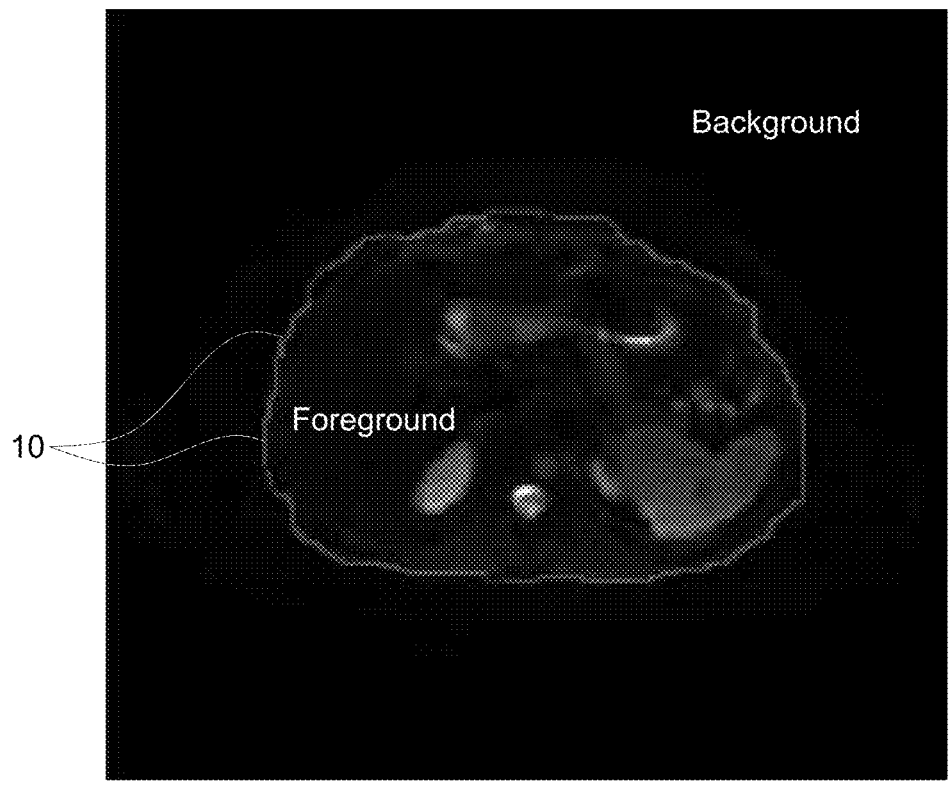

FIG. 1(*a*) shows an example of a fully reconstructed image of brain acquired using magnetic resonance imaging (MRI) system and FIG. 1(*b*) shows an example of a fully reconstructed image of abdomen acquired using magnetic resonance imaging (MRI) system. The area of interest or the useful portion or the foreground image is portion of the image showing internal structures of the brain and the abdomen in FIGS. 1(*a*) and 1(*b*) respectively. The background of the image is clinically irrelevant, non-anatomical portion of the image. The background of image is separated from the foreground image by an image boundary (10) as shown in FIGS. 1(*a*) and 1 (*b*).

Figure 2:
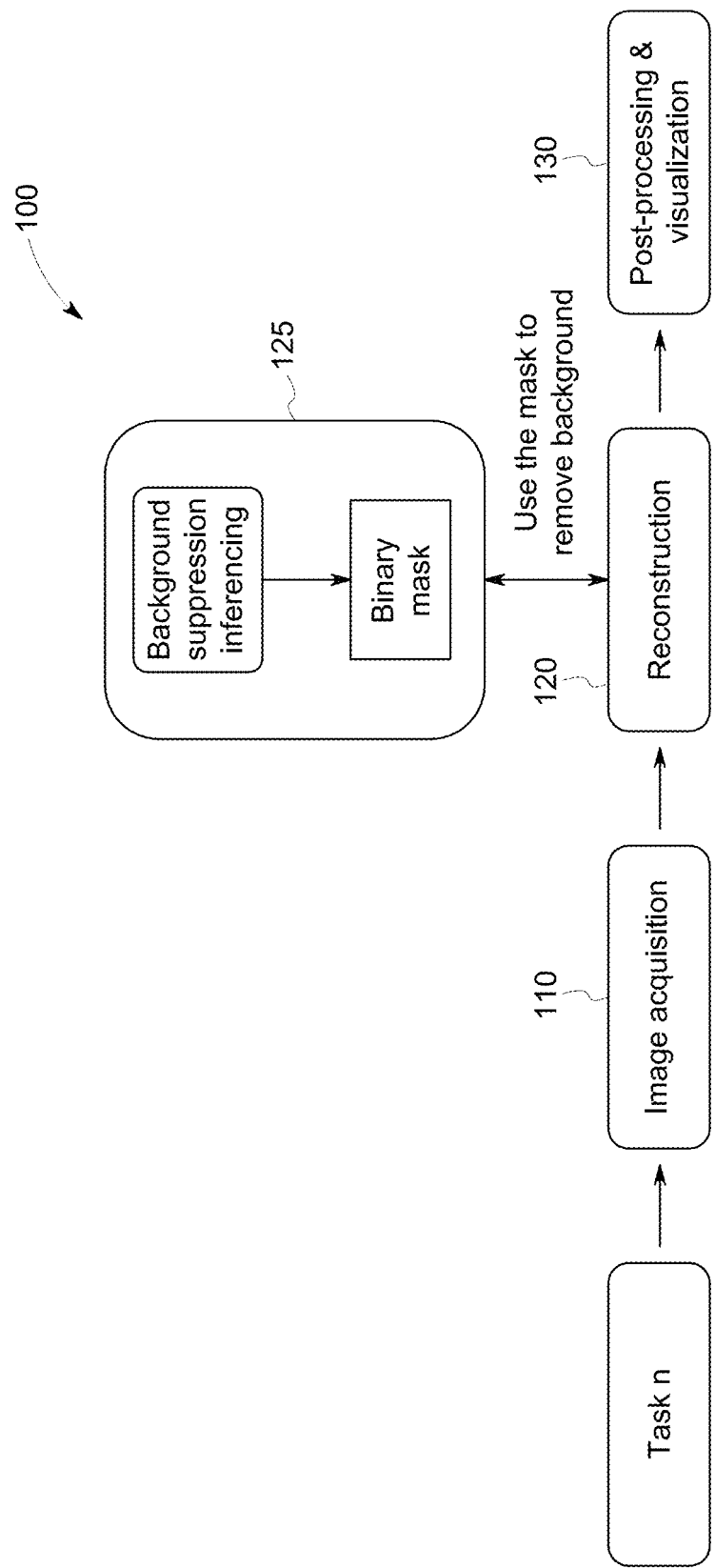
FIG. 2 illustrates an example Image Acquisition, reconstruction and postprocessing system according to an aspect of the disclosure.

FIG. 2 shows an example system (100) according to one aspect of the disclosure. The system (100) includes an image acquisition system (110) configured to acquire images of a subject (not shown). The image acquisition system (110) in the present example may be a magnetic resonance imaging (MRI) device. Although the various embodiments are described with respect to magnetic resonance imaging (MRI) device, the various embodiments may be utilized with any suitable medical imaging system, for example, X-ray, computed tomography (CT), single photon emission computed tomography, positron emission tomography (PET), an ultrasound imaging device, or the like.

Task (Task 1) of acquiring images through a localizer scan precedes any other tasks (tasks 2 to task n) for acquired other type of high resolution images. The image acquisition system (110) of a medical imaging device acquires the data in k-space that is reconstructed into an image by image reconstruction module (120) which is also referred as image reconstruction pipeline. Image reconstruction module typically involves reconstruction of image from k-space data and processing it further to get human readable, diagnostic quality DICOM images. An image reconstruction module (120) is operatively connected to the image acquisition system (110). The image reconstruction module (120) may be a processor, or a computer-based device implemented in any method or technology for short-term and long-term storage of information, such as, computer-readable instructions, data structures, program modules and sub-modules, or other data in any device. Therefore, the image reconstruction module (120) may contain encoded and executable instructions embodied in a tangible, non-transitory, computer readable medium, including, without limitation, a storage device and/or a memory device. Such instructions, when executed by a processor, cause the processor to perform at least a portion of the methods described herein.

A deep learning module (125) is operatively connected to the image reconstruction module (120). The deep learning module (125) is configured to receive several images from the image reconstruction module (120). In some embodiments, the deep learning module (125) may be located within the image reconstruction module (120) and in other embodiments, the deep learning module (125) is remotely located from the image reconstruction module (120). The deep learning module (125) is trained to identify and differentiate background pixels from the foreground pixels in an image. The deep learning module (125) contains a background suppression inferencing algorithm that is trained to identify the background pixels. The deep learning module (125) generates a binary mask (explained in FIG. 3) that is used by image reconstruction module (120) to carry out suppressing of background pixels by setting the value of background pixels to zero and not processing them from that point onwards in each subsequent reconstruction operation thereby suppressing the background pixels. The background suppressed images obtained from the binary mask are processed further by the post-processing and visualization module (130) to obtain user viewable images with improved image quality (IQ).

Machine learning techniques, whether using deep learning networks or other experiential/observational learning system, may be used to locate an object in an image, understand speech and convert speech into text, and improve the relevance of search engine results, for example. Deep learning is a subset of machine learning that uses a set of algorithms to model high-level abstractions in data using a deep graph with multiple processing layers including linear and non-linear transformations. While many machine learning systems are seeded with initial features and/or network weights to be modified through learning and updating of the machine learning network, a deep learning network trains itself to identify "good" features for analysis. Using a multilayered architecture, machines employing deep learning techniques may process raw data better than machines using conventional machine learning techniques. Examining data for groups of highly correlated values or distinctive themes is facilitated using different layers of evaluation or abstraction.

Deep Learning and Machine Learning

Deep learning is a class of machine learning techniques employing representation learning methods that allows a machine to be given raw data and determine the representations needed for data classification. Deep learning may ascertain structure in data sets using backpropagation algorithms. Deep learning machines may utilize a variety of multilayer architectures and algorithms. While machine learning, for example, involves an identification of features to be used in training the network, deep learning may process raw data to identify features of interest without the external identification.

Deep learning in a neural network environment includes numerous interconnected nodes referred to as neurons. Input neurons, activated from an outside source, activate other neurons based on connections to those other neurons which are governed by the machine operating conditions. A neural network behaves in a certain manner based on its own sequences. Learning refines the machine output the connections between neurons, and weighting of the connections in the network such that the neural network behaves in a desired manner.

In one example, Deep learning that utilizes a convolutional neural network segments data using convolutional filters to locate and identify learned, observable features in the data. Each filter or layer of the CNN architecture transforms the input data to increase the selectivity and invariance of the data. This abstraction of the data allows the machine to focus on the features in the data that the machine attempts to classify and to ignore irrelevant background information.

Deep learning operates on the understanding that many datasets include high level features which include low level features. In an image, edges form into motifs, motifs form into parts, and then parts form into an object. These hierarchies of features may be found in many different forms of data such as speech and text, etc. While examining an image, for example, it is more efficient to look for edges, motifs, and parts of an object than looking for the object directly.

Learned observable features include objects and quantifiable regularities learned by the machine during supervised learning. A machine provided with a large set of well classified data is better equipped to distinguish and extract the features in successful classification of new data as compared to machines that learn with fewer data sets.

A deep learning machine that utilizes transfer learning may connect data features to classifications affirmed by a human expert. Conversely, the same machine may, when informed of an incorrect classification identified by a human expert, update the system for classification of image data. Settings and/or other configuration information, for example, may be guided by learned use of the settings and/or other configuration information, and, as the machine learning system is used more (e.g., repeatedly and/or by multiple users), the number of variations in settings and/or other configuration information may be reduced for a situation.

An example deep learning neural network may be trained on a set of expert classified data, for example. This set of data builds the neural network, and this would be supervised learning. During supervised learning, the neural network may be tested whether the desired behavior has been achieved. A neural network may also be trained by unsupervised learning that allows performing more complex processing tasks than supervised learning. In unsupervised learning, the machine is allowed to learn on its own without any human intervention and discover the information.

Once a desired neural network behavior has been achieved (e.g., a machine has been trained to operate according to a specified threshold, etc.), the machine may be deployed for use (e.g., testing the machine with "real" data, etc.). During operation, neural network classifications may be confirmed or denied (e.g., by an expert user, expert system, reference database, etc.) to continue improving neural network behavior. The example neural network is then in a state of transfer learning, as conditions for classification that determine neural network behavior are updated based on ongoing interactions. In certain examples, the neural network may provide direct feedback to different modalities and neural networks within the healthcare facility that may be connected to the neural network. In certain examples, the neural network outputs data that is buffered (e.g., via the cloud, etc.) and validated before it is provided to another process.

Deep learning machines using convolutional neural networks (CNNs) may be used for image analysis. CNN analysis may be used for facial recognition in natural images, computer-aided diagnosis (CAD), etc.

High quality medical image data may be acquired using one or more imaging modalities, such as magnetic resonance imaging (MRI). Medical image quality is affected by the machines producing the image and the patient. A patient moving during an MRI may create a blurry or distorted image that may prevent accurate diagnosis, for example.

Medical images are largely interpreted by physicians, but these interpretations may be subjective, affected by the condition of the physician's experience in the field and/or fatigue. Image analysis via machine learning may be used to support a healthcare practitioner's workflow.

Deep learning machines may provide computer aided detection to improve image analysis with respect to image quality and classification, for example. However, issues facing deep learning machines applied to the medical field often lead to numerous false classifications, for example small training datasets and the need of repetitive adjustments.

Deep learning machines may utilize transfer learning when interacting with physicians to overcome the challenges of small datasets available for supervised training. These deep learning machines may improve their computer aided diagnosis over time through training and transfer learning.

In the exemplary embodiment, computer system includes a user interface that receives at least one input from a user. User interface may include a keyboard that enables the user to input pertinent information. User interface may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computer system includes a presentation interface that presents information, such as input events and/or validation results, to the user. Presentation interface may also include a display adapter that is coupled to at least one display device. More specifically, in the exemplary embodiment, display device may be a visual display device, such as a cathode ray tube (CRT), a liquid crystal display (LCD), a light-emitting diode (LED) display, and/or an "electronic ink" display. Alternatively, presentation interface may include an audio output device (e.g., an audio adapter and/or a speaker) and/or a printer.

Computer system also includes a processor module and a memory module. The processor module is coupled to user interface, presentation interface and memory module via a system bus. In the exemplary embodiment, processor module communicates with the user, such as by prompting the user via presentation interface and/or by receiving user inputs via user interface. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, memory module includes one or more devices that enable information, such as executable instructions and/or other data, to be stored and retrieved. Moreover, memory module includes one or more computer readable media, such as, without limitation, dynamic random-access memory (DRAM), static random-access memory (SRAM), a solid state disk, and/or a hard disk. In the exemplary embodiment, memory module stores, without limitation, application source code, application object code, configuration data, additional input events, application states, assertion statements, validation results, and/or any other type of data. Computer system, in the exemplary embodiment, may also include a communication interface that is coupled to processor module via system bus. Moreover, communication interface is communicatively coupled to data acquisition devices.

In the exemplary embodiment, processor module may be programmed by encoding an operation using one or more executable instructions and providing the executable instructions in memory module. In the exemplary embodiment, processor is programmed to select a plurality of measurements that are received from data acquisition devices.

In operation, a computer system executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Mask

A mask image of an input image is an image where intensity values at some pixels of the input image are set to zero, and intensity values at other pixels of the input image are set to non-zero. The mask information is applied to the original image as follows to get the masked image. If the value of a mask pixel is zero then the intensity value for the corresponding pixels in the original image is set to background pixel value—0 for example and pixels in the original image corresponding to the pixels with non-zero intensity value in mask remain unchanged. In other words, masked image is obtained by performing pixel wise intensity multiplication of mask pixels and pixels in the original image.

Figure 3:
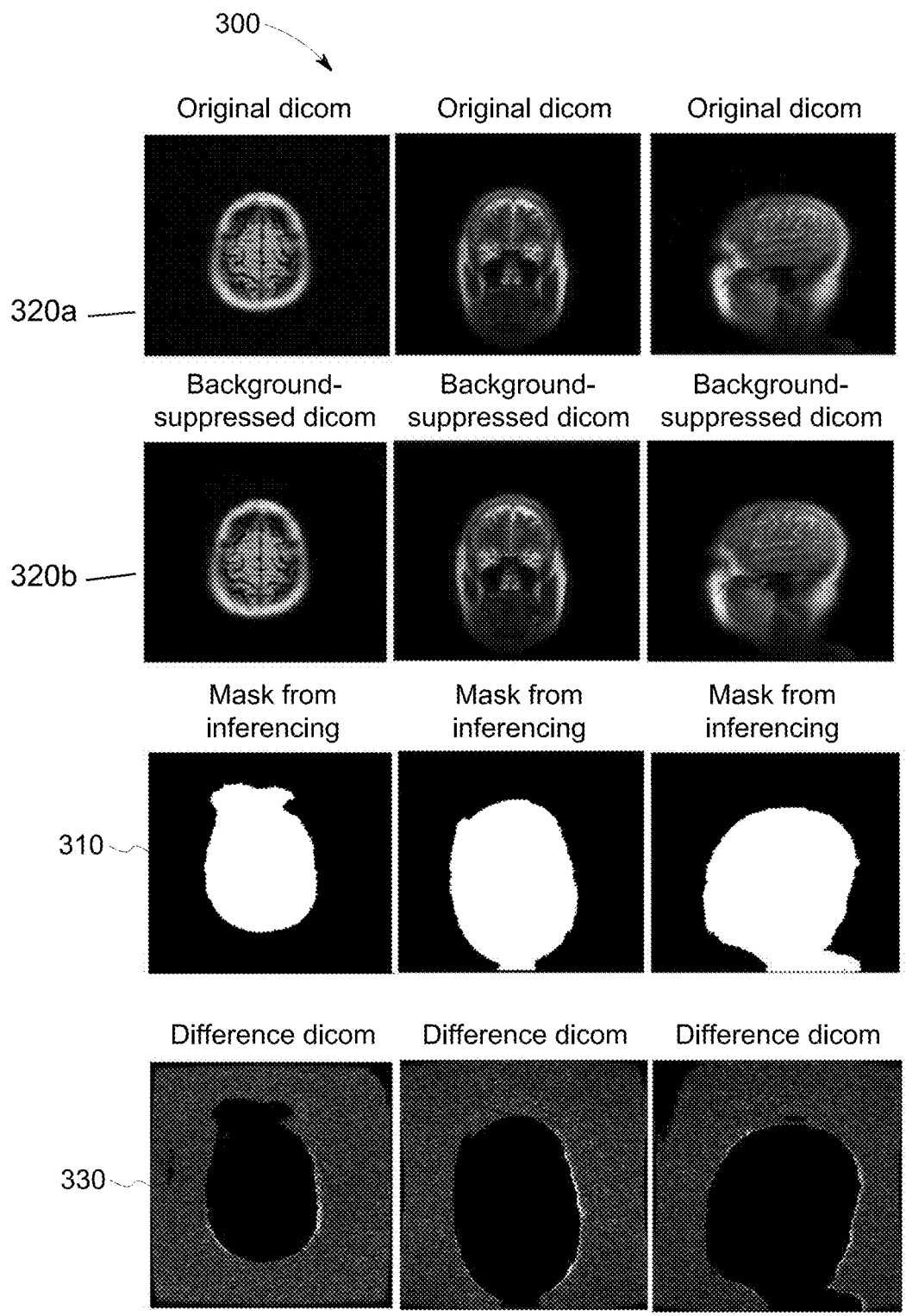
FIG. 3 illustrates an exemplary mask along with its impact on original image according to an embodiment of the disclosure.

FIG. 3 shows an exemplary mask (310) according to an embodiment of the disclosure. The mask (310) is applied on an image (320a) obtained from the magnetic resonance imaging (MRI) system to suppress the background pixels and extract only the meaningful foreground pixels and a final image (320b) with improved image quality is obtained. The image (330) indicates a difference between the original (320a) DICOM and suppressed (320b) DICOM. In the exemplary process, the images obtained from the magnetic resonance imaging (MRI) system are reconstructed from k-space. During reconstruction pipeline, foreground portion of the image is masked using the deep learning module (125) explained above. Before applying the mask, morphological operations are performed on the mask (310) to recover any potential loss of anatomical regions. As part of all subsequent scan tasks, the same mask (setting background pixels value to zero) is applied to derive background suppressed images during reconstruction pipeline. The identified background pixels outside the mask (310) will be skipped for processing during remaining stages of reconstruction for Digital Imaging and Communications in Medicine (DICOM) generation. FIG. 3 shows localizer images reconstructed with and without background suppression, and their masks. The last row shows the background noise that was to be eliminated from an image (320a), indicating the significant potential and benefit from using the model on localizer images itself The masks of the localizer images may then be used during reconstruction of images acquired by subsequent scan tasks.

Localizer images are pilot images or scouts that are obtained from same imaging system. The localizer image is an image of a portion of the body that includes the area from which the image series is taken but localizer images are generated for a larger area than the area of actual scan from where the image series is generated. Localizer images are also used to identify the location of the area of interest.

Figure 4:
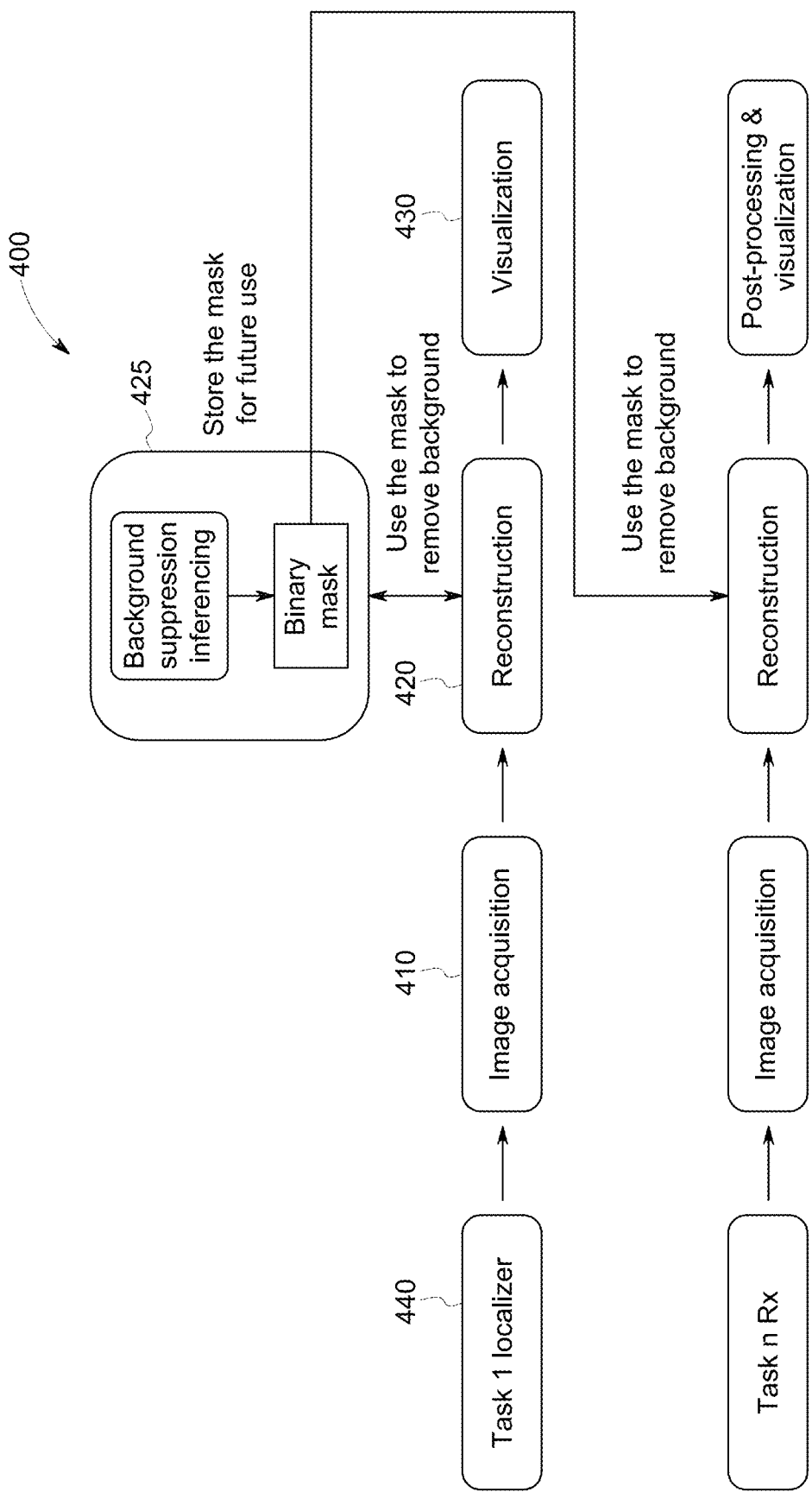

FIG. 4 shows a structure similar to the system of FIG. 2 and additionally shows a localizer (440) used to generate localizer images that are processed using the deep learning module (425) in similar manner as described with reference to FIG. 2. Localizer images are reconstructed from k-space and during this reconstruction, a foreground mask of the deep learning module (425) is used to mask the foreground pixels and suppress the background pixels. Before applying the mask, morphological operations are performed on the mask to recover any potential loss of anatomical regions and images are returned to ongoing localizer reconstruction process (420). During all subsequent scan tasks, same mask is loaded and applied to (setting background pixels value to zero) to get background suppressed images during reconstruction and the identified background pixels will be skipped for remaining stages of reconstruction for Digital Imaging and Communications in Medicine (DICOM) image generation. This reduces computational load on image reconstruction and post processing system (120/130 and 420/430) by suppressing the background pixels and processing only the foreground pixels, thereby saving valuable time to generate high quality images. This workflow applies background suppression as a part of the reconstruction of the localizer scan. The generated masks (one for each axial, sagittal and coronal orientations) will be used to obtain background suppressed image as part of reconstruction for all further scan tasks.

Figure 5:
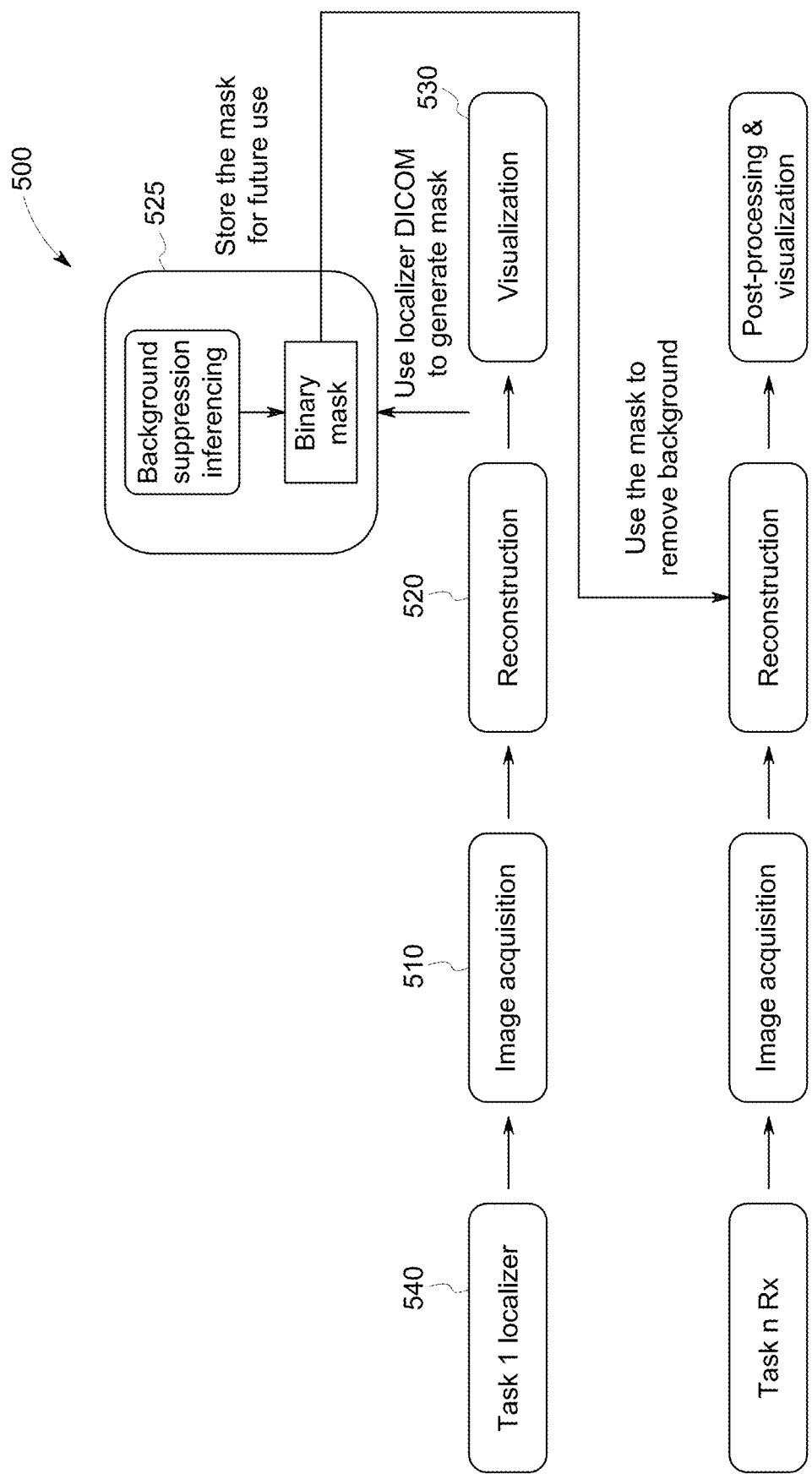

In another embodiment as shown in FIG. 5, a localizer scan task (540) when prescribed to an image acquisition system (510) it generates a DICOM Image using Image Reconstruction model (520). These DICOM localizer images are processed using the deep learning module (525) in similar manner as described with reference to FIG. 2. In addition to the system explained with reference to FIG. 4, a mask is generated using the localizer DICOM images and the mask is stored for future use. That is, the localizer images are reconstructed from k-space using available reconstruction pipeline to get DICOM Image and after this reconstruction, a foreground mask from the deep learning module (425) is used to mask the foreground pixels and suppress the background pixels. Before applying the mask, morphological operations are performed on the mask to recover any potential loss of anatomical regions and images are returned to ongoing localizer reconstruction process (420). During all subsequent scan tasks, the same mask is used to (setting background pixels value to zero) to generate background suppressed images during reconstruction and identified background pixels will be skipped for remaining stages of reconstruction for Digital Imaging and Communications in Medicine (DICOM) generation.

Figure 6:
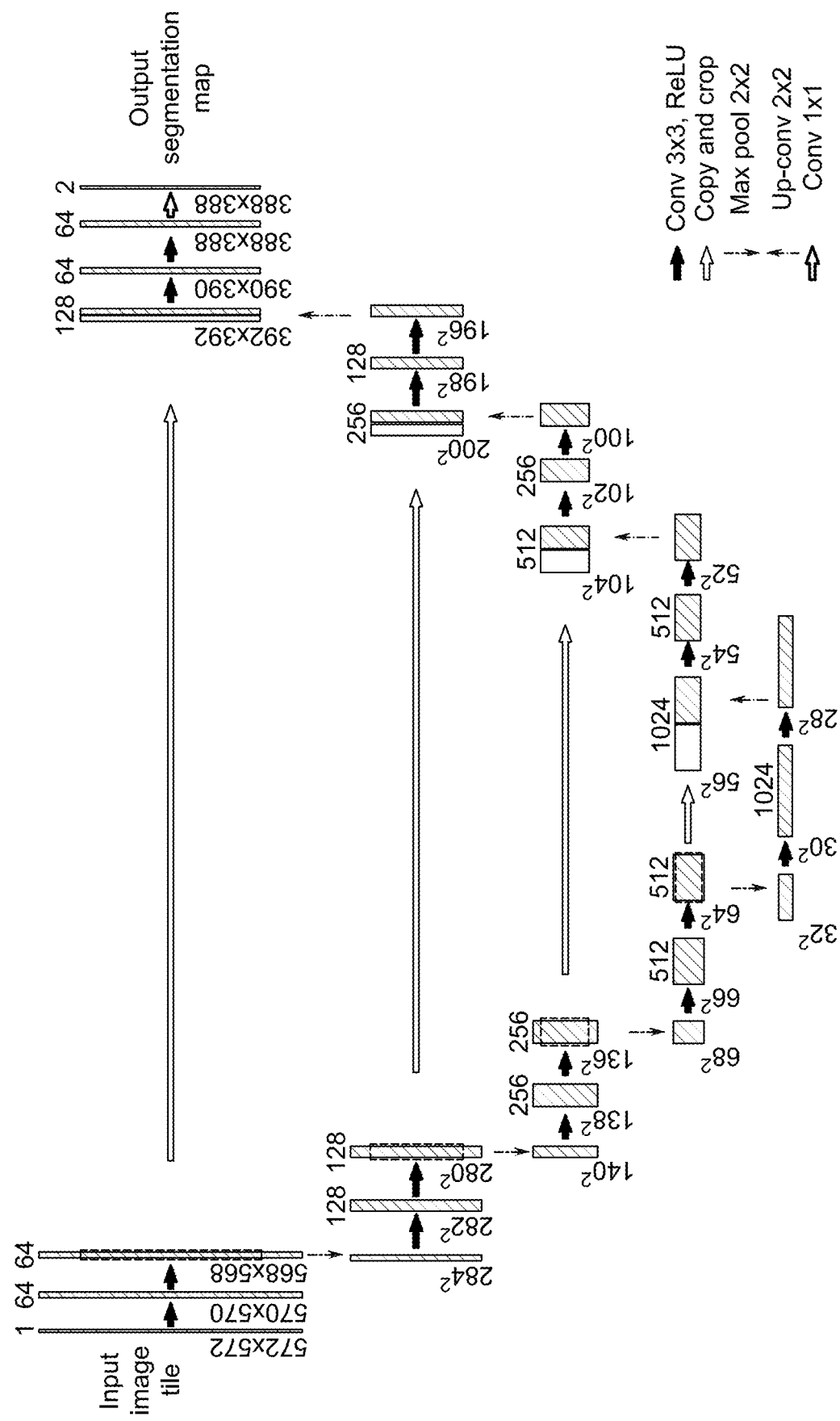
FIG. 6 illustrates an example Convolutional Neural Network (CNN) employing U-Net architecture.

Any improvement in image quality is dependent on the accuracy of the segmentation model. The images obtained using the above methods were evaluated using a two-fold-evaluation strategy. This two-fold-evaluation strategy includes evaluating performance metrics of U-Net, followed by image reviews by clinical application specialists. FIG. 6 shows exemplary convolution neural network such as U-Net architecture implemented in python using Keras library. However, it is within the scope of the present disclosure to use other computing languages and libraries. In the exemplary embodiment, diffusion-weighted images of the brain and abdomen obtained from MRI scanners have been used. Data of relatively low b-value from these diffusion-weighted scans was taken. Several brain and abdomen images may be used for training, testing and validation. These training, testing and validation data sets may come from a different subjects. The training may be performed with a split of 90-10 for training-validation.

The performance metrics of deep learning module such as U-Net was followed by image reviews by clinical application specialists. In one example, U-Net was used to perform segmentation on test data, and an average DICE score of 0.94 (min=0.713, max=0.982) was achieved. DICE score measures similarity between two image samples. Signal to noise ratio (SNR) was measured for DICOMs reconstructed with and without background-suppression and slightly increased SNR was observed in the former. This results in improvement in performance of subsequent reconstruction sections and post-processing filtering operations. The background suppressed DICOMs were presented/loaded with a better Window Width/Window Level (WW/WL) than original DICOMs in post-processing visualization applications thus improving the visually perceived image quality. Masks were generated by running inference during image reconstruction. In the exemplary embodiment, an average inference time of foreground and background per slice is approximately 0.2 s. and reusability of the model across different MR scan protocols and all MR Reconstruction pipelines (Cartesian and non-Cartesian) with better IQ has been demonstrated. Systems and methods discussed herein were tested using sample brain datasets, and masks obtained from background-suppressed localizer images have also been shown in FIGS. 7-10.

Figure 7A:
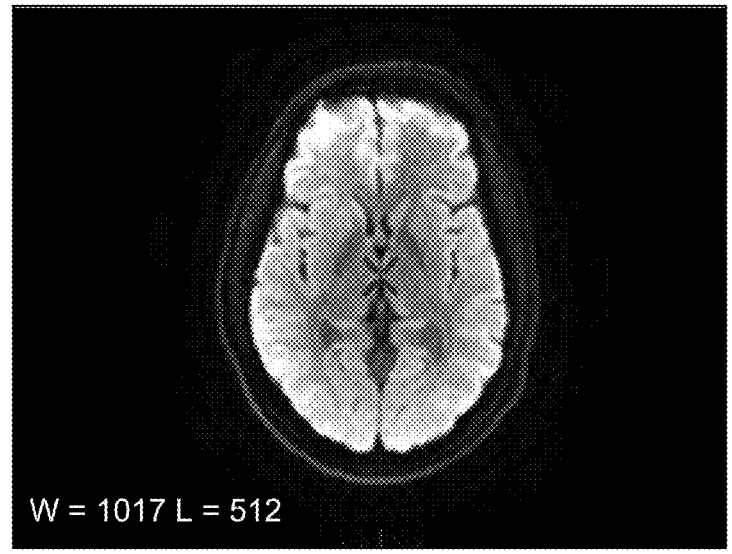
FIG. 7(*a*)-7(*b*) illustrate background suppressed images of brain having improved default windowing.
Figure 7B:
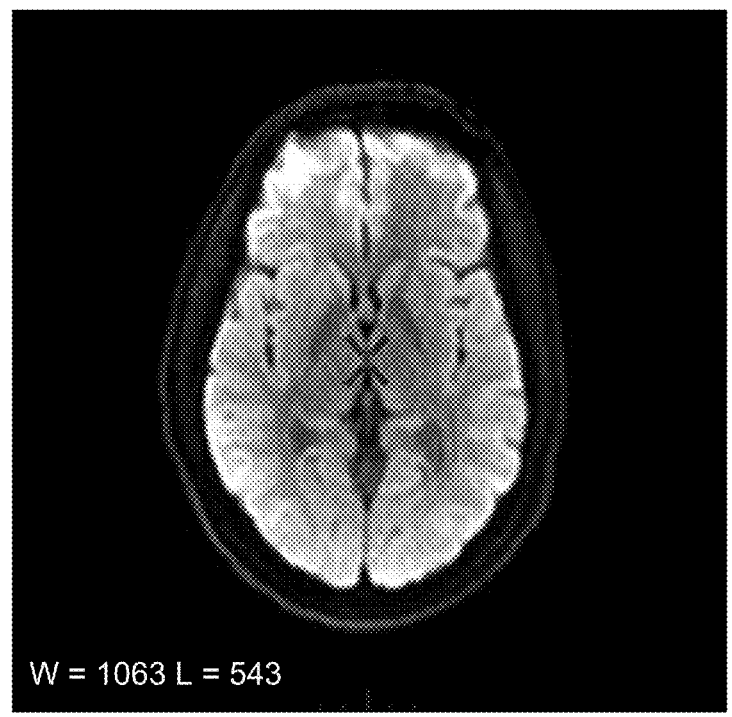

FIGS. 7 and 8 show images reconstructed with and without background suppression on sample echo planar imaging (EPI) data, obtained using the echo planar imaging (EPI) reconstruction pipeline. Windowing is a visualization technique where a pixels having a value in a specific subset of dynamic range of the image are modified to change the contrast and brightness for better visualization. Impact on overall noise distribution has also been demonstrated on the same. FIG. 7(a)-7(b) shows background suppressed images of brain having improved default windowing. FIG. 7(a) is an original image generated without use of background suppression technique and FIG. 7(b) is an image generated after suppression of background pixels. In the present embodiment of FIG. 7(b), the background suppressed images exhibit improved default windowing and contrast.

Figure 8A:
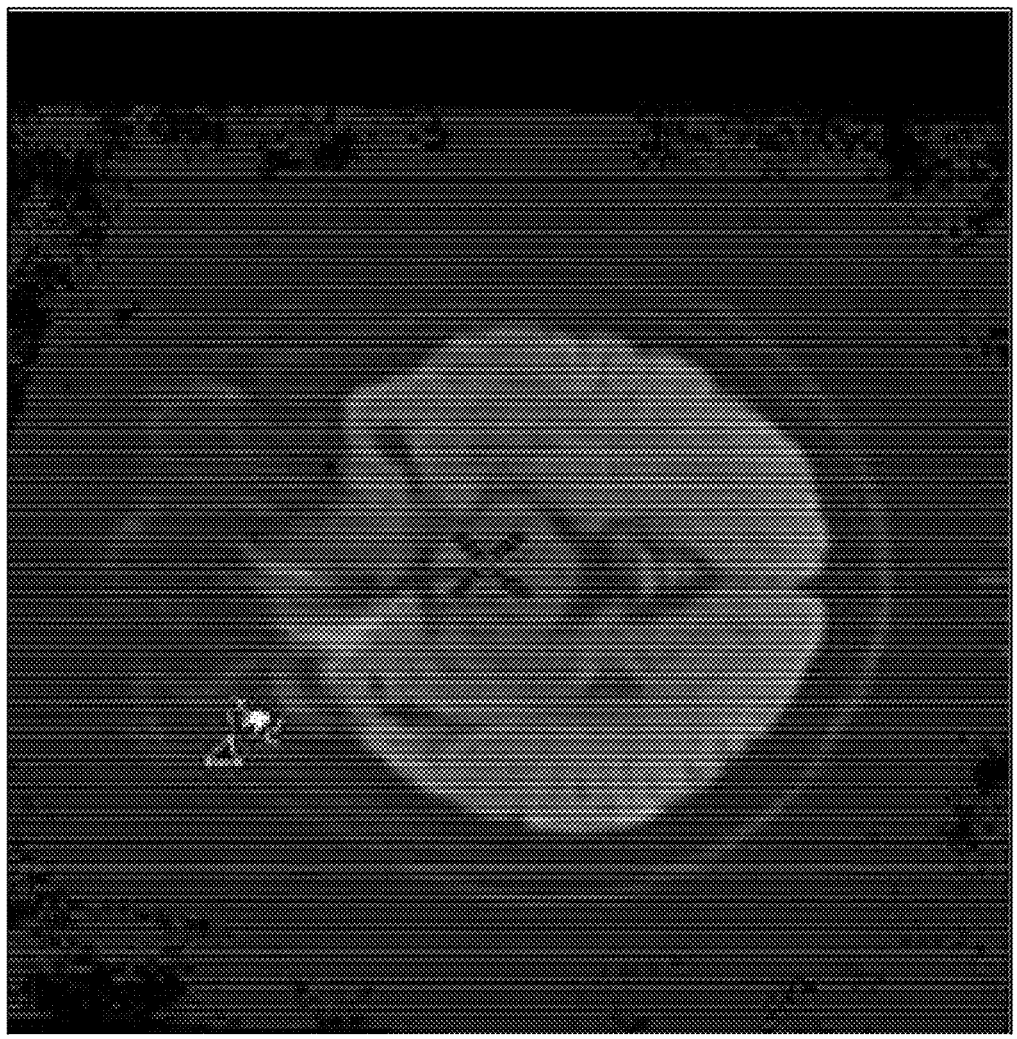
FIGS. 8(*a*)-8(*b*) illustrates overlay in an image viewer for brain images showing the non-zero pixels in that image.
Figure 8B:
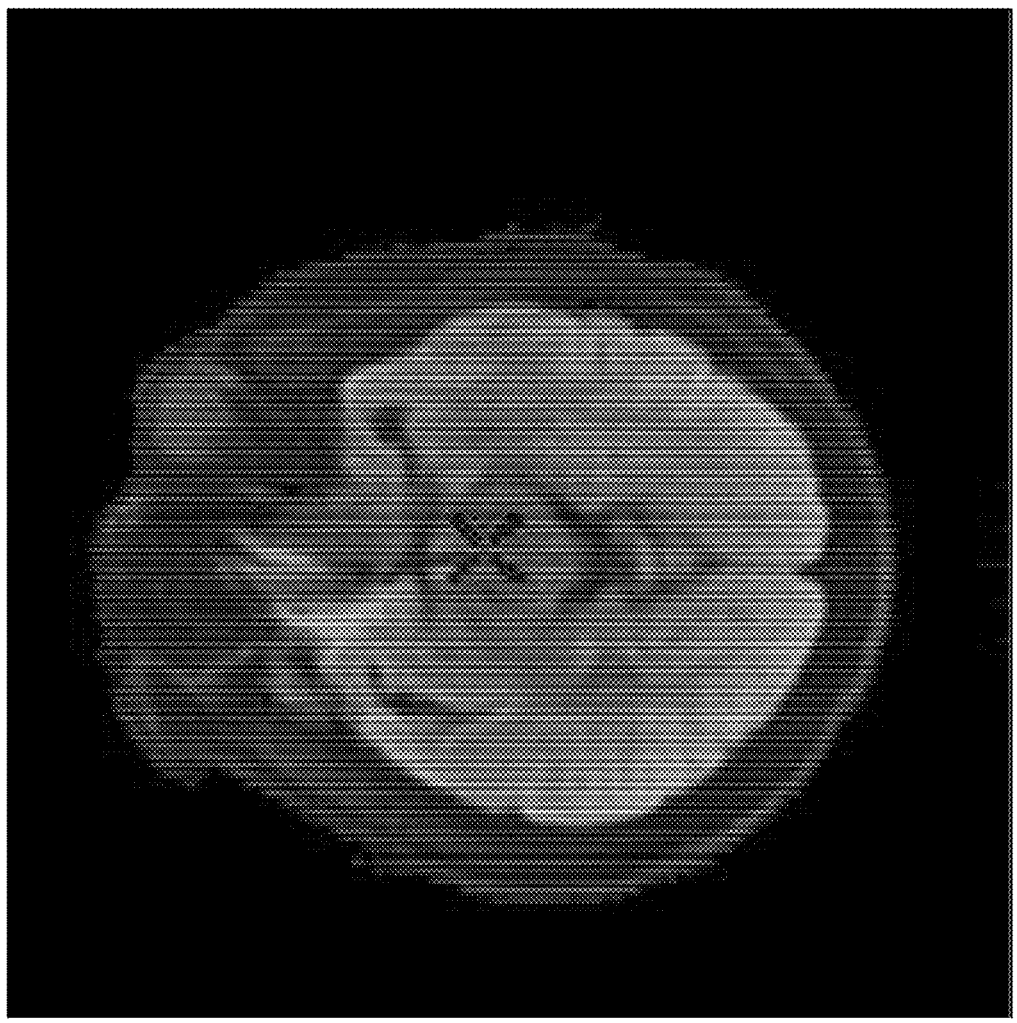

FIGS. 8(a)-8(b) show overlay showing pixels with non-zero values in original image (8a) and background-suppressed image (8b). In original image without background suppression, pixel in the areas surrounding the features of brain are still present in the image. This part of image has no significance and they add to the computational burden during reconstruction and visualization. In the background suppressed image, only the clinically relevant parts of the image are seen, and the image has better contrast for a reader of the image than the original image.

Figure 9A:
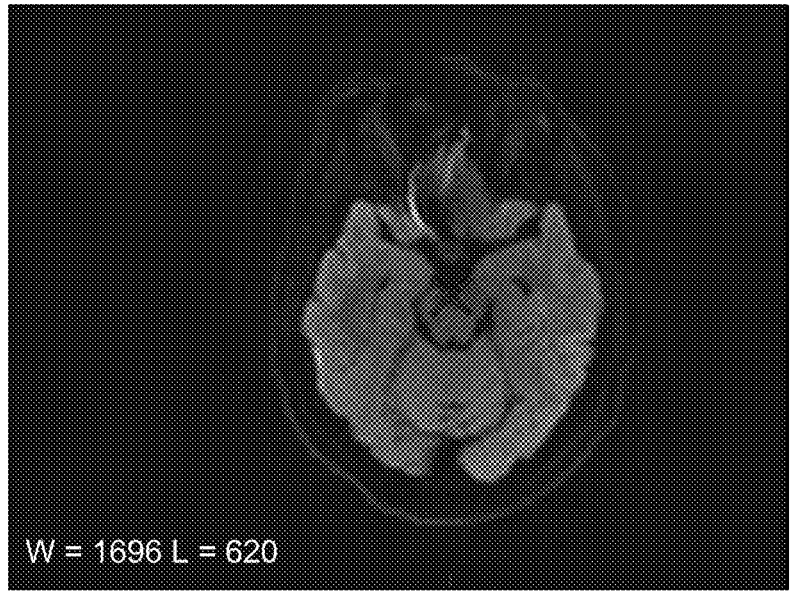
FIGS. 9(*a*)-9(*b*) illustrate images obtained without and with the use of background suppression module respectively at the same window level/window width.
Figure 9B:
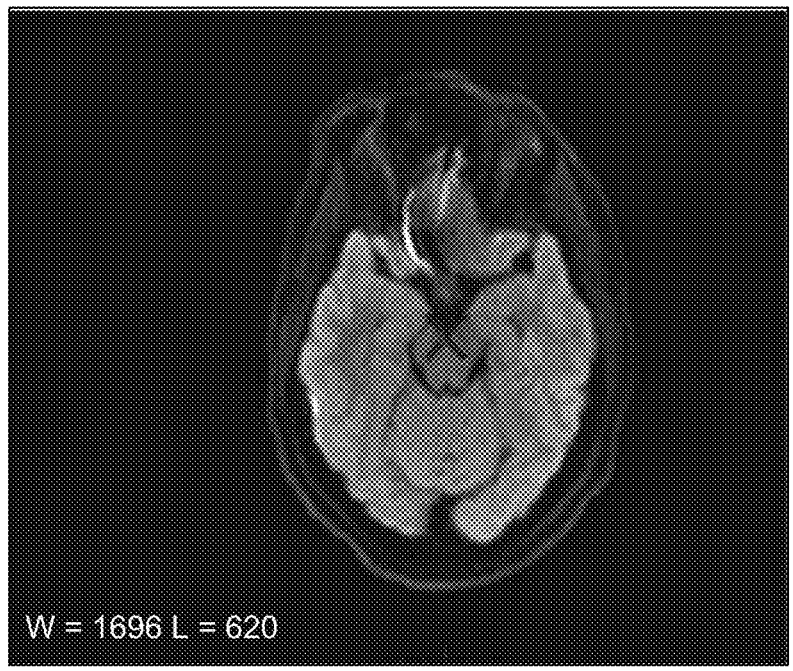
Figure 10A:
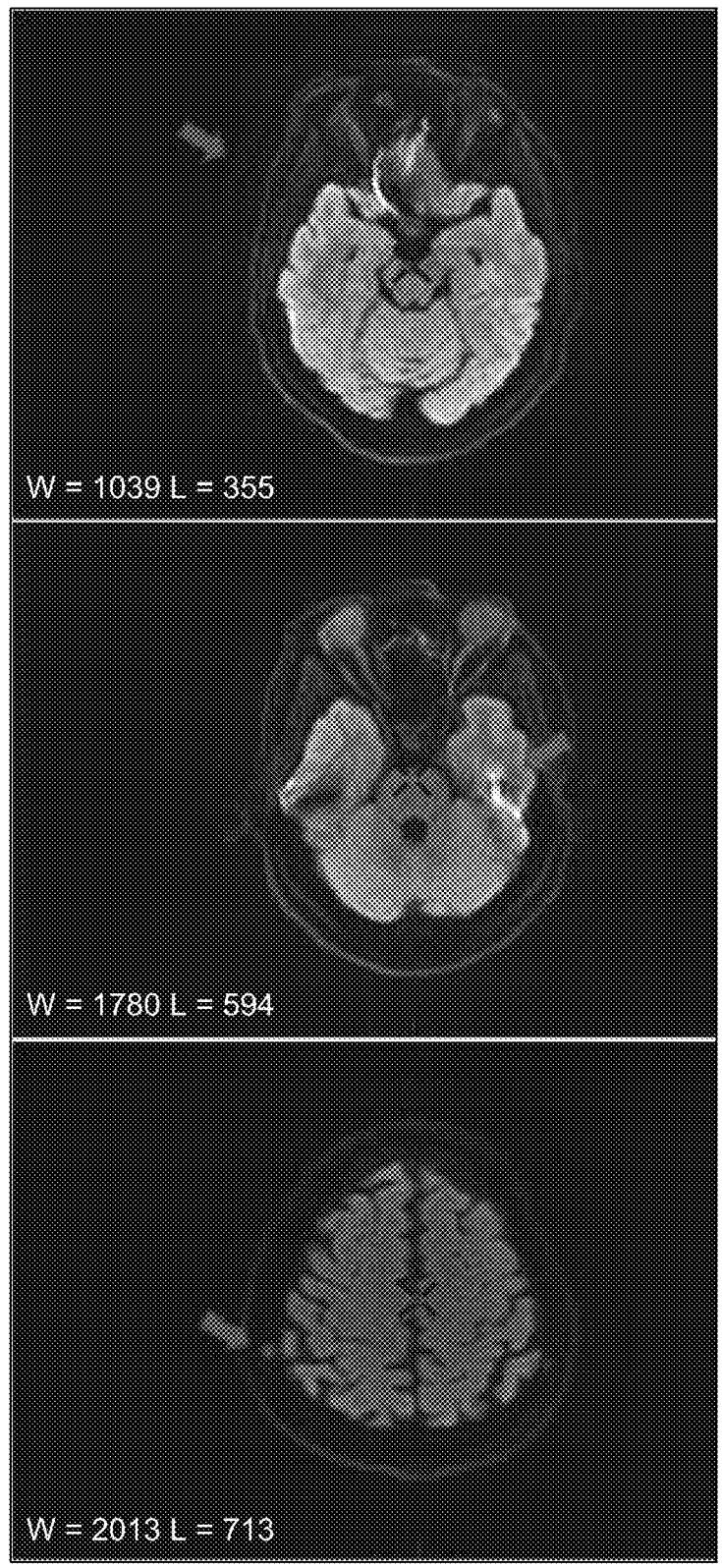
FIGS. 10(*a*)-10(*b*) illustrate examples of the images obtained with the background suppression technique.
Figure 10B:
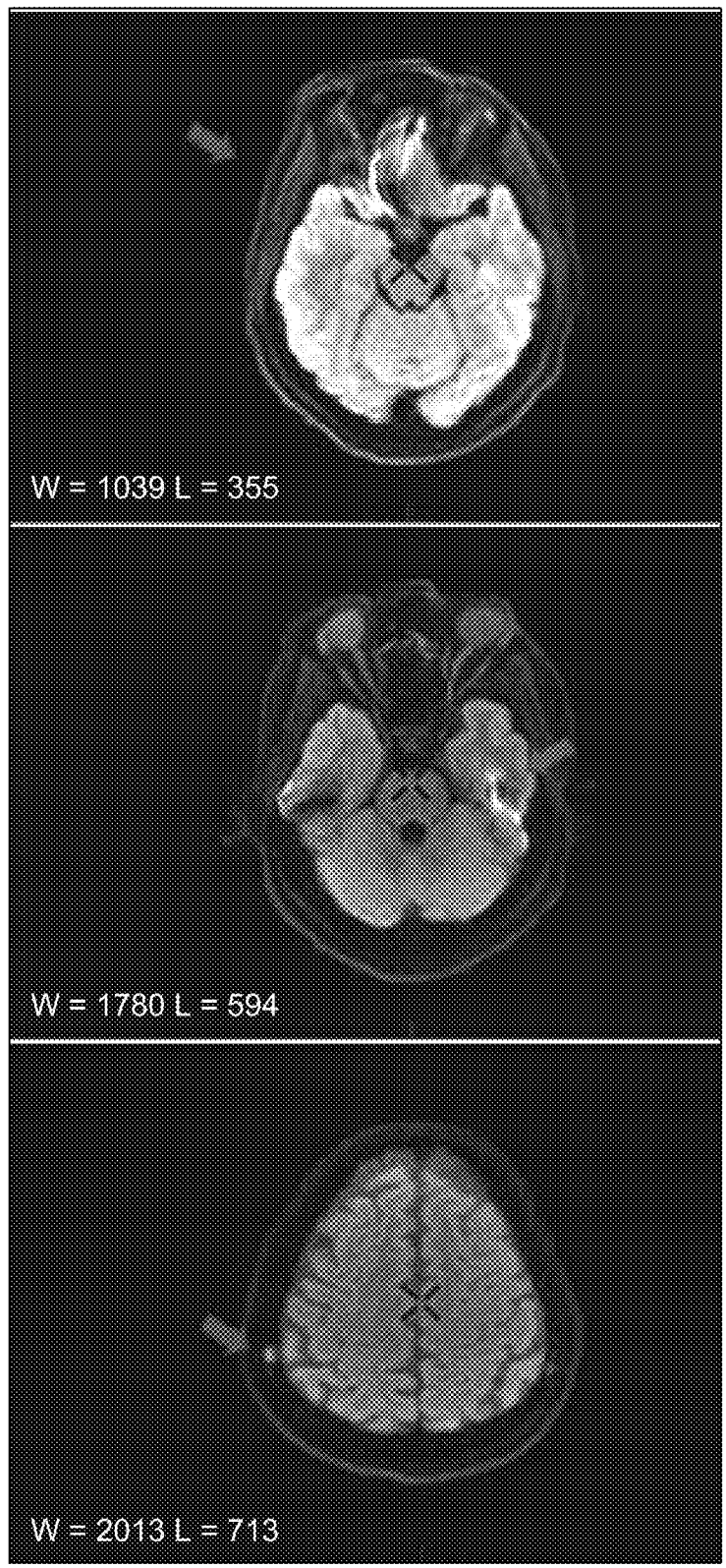

FIGS. 9(a)-9(b) show the results obtained without (shown in FIG. 9(a)) and with (shown in FIG. 9(b)) the use of background suppression module. Both the images are displayed at same window width and window level to appreciate impact of background suppression. FIG. 9(a) demonstrates the background noise pattern that considerably reduces the image quality of the anatomical region and the overall image brightness has appreciably reduced. FIG. 9(b) demonstrates use of background suppression technique resulting in the images having visually sharp anatomical boundaries with no background noise residual and overall improved contrast. According to an aspect of the disclosure, FIGS. 10(a) and 10(b) illustrate the further examples of the images obtained with the background suppression technique. The images processed using the background suppression technique of the present disclosure exhibit improved image quality parameters.

Figure 11:
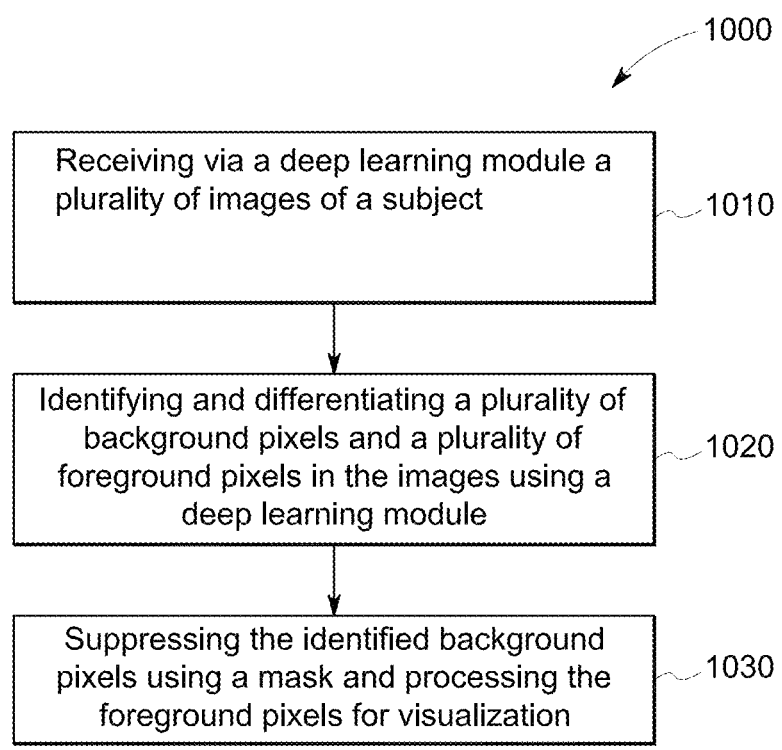
FIG. 11 illustrates exemplary method for background suppression in image processing for a medical device according to an aspect of the present disclosure.

FIG. 11 shows an exemplary method (1000) of image processing for a medical device according to an aspect of the present disclosure. The method (1000) receiving (1010), via a deep learning module (125), a plurality of images of a subject acquired using an image acquisition system (110) of the medical device (MRI, X-ray, CT, PET, Ultrasound etc.). The system (100) of FIG. 2 is employed for image acquisition, and system (100) includes an image acquisition system (110) configured to acquire images of the subject (not shown). The image acquisition system (110) in the present example is a magnetic resonance imaging (MRI) device. Although the various embodiments are described with respect to magnetic resonance imaging (MRI) device, the various embodiments may be utilized with any suitable medical imaging system, for example, X-ray, computed tomography, single photon emission computed tomography, an ultrasound imaging system, or the like.

The method (1000) further includes identifying and differentiating (1020) a plurality of background pixels from a plurality of foreground pixels in the images using a deep learning module (125). The images (raw k-space data) acquired by the image acquisition device (110) are processed by some part of image reconstruction module (120) to obtain Image pixels of the subject and require further reconstruction. An image reconstruction module (120) is operatively connected to the image acquisition device (110). The image reconstruction module (120) may be a processor, or a computer-based device implemented in any method or technology for short-term and long-term storage of information, such as, computer-readable instructions, data structures, program modules and sub-modules, or other data in any device. Therefore, the image reconstruction module (120) may contain encoded and executable instructions embodied in a tangible, non-transitory, computer readable medium, including, without limitation, a storage device and/or a memory device. Such instructions, when executed by a processor, cause the processor to perform at least a portion of the methods described herein. A deep learning module (125) is operatively connected to the image reconstruction module (120). The deep learning module (125) is configured to receive several images from the image reconstruction module (120). In some embodiments, the deep learning module (125) may be located within the image reconstruction module (120) and in other embodiments, the deep learning module (125) may be remotely located from the image reconstruction module (120).

The method (1000) further includes suppressing (1030) the identified background pixels using a mask and processing the foreground pixels for visualization. The deep learning module (125) is trained to identify and differentiate background pixels from the foreground pixels in an image. The deep learning module (125) generates a background suppression inferencing algorithm that is trained to identify the background pixels. The deep learning module (125) generates a binary mask (explained in FIG. 3) that is used by image reconstruction module (120) to carry out suppressing of background pixels by setting the value of background pixels to zero and not processing them from that point onwards in each subsequent reconstruction thereby suppressing the background pixels. The background suppressed images are processed further by the post-processing and visualization module (130) to display user viewable images.

The disclosed method addresses several problems in the field of image reconstruction. Some of the advantages of the method include removal of background noise or background artefact as part of image reconstruction while no data of anatomical regions is lost. The suppressed background pixels may be stored for reasonable time as a backup for recovery purposes or for any specific processing needs in post processing module. In case of operational failure of the device, the backup data may be used to generate the image. Performance improvement of subsequent image processing section and the reconstruction pipeline after application of background-suppression algorithm is achieved due to removal of noise and image properties like contrast and signal to noise ratio (SNR) are improved. Improved Window Width or Window Level computation during the DICOM generation is possible without any influence from the background noise and improved Window Width or Window Level of reconstructed image on load. The present system may also enable to improve image presentation features like visualization of functional maps.

The method (1000) provides many operational advantages as the method is reusable across different MRI reconstruction pipelines, usable for all anatomies and usable for different image scanning protocols. The method (1000) ensures reproducibility of image quality during scanning (on load) for different post-processing software for different vendors and achieves 'vendor-neutral visualization'. The method (1000) may be implemented in multiple workflows by reusing the same concept or solution of background suppression. Also, deep learning-based solution makes it easy to adapt, evolve and has promise of continuous learning. The method (1000) is not only implemented and integrated on existing platforms such as MR Reconstruction Platform but also the method (1000) may be extended to other medical imaging modalities.

From the foregoing, it will be appreciated that the above disclosed methods, apparatus, and articles of manufacture have been disclosed to monitor, process, and improve operation of imaging and/or other healthcare systems using a plurality of deep learning and/or other machine learning techniques.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

The invention claimed is:

1. A method for image processing for a magnetic resonance imaging (MRI) system, the method comprising:
   receiving, via a deep learning module, a plurality of magnetic resonance images of a subject acquired using an image acquisition system of the MRI system;
   differentiating a plurality of background pixels from a plurality of foreground pixels in the plurality of magnetic resonance images using the deep learning module, wherein the foreground pixels correspond to an anatomical region of the subject and the background pixels correspond to a non-anatomical and clinically irrelevant region located outside the anatomical region;
   suppressing the background pixels using a mask by setting the values of only the background pixels to zero;
   processing the foreground pixels to reconstruct higher image quality magnetic resonance images than the plurality of magnetic resonance images for visualization, wherein the plurality of magnetic resonance images and the higher image quality magnetic resonance images comprise localizer images;

storing the mask; and utilizing the mask on magnetic resonance imaging data acquired in subsequent scans to generate diagnostic quality magnetic resonance images.

2. The method as claimed in claim 1, further comprising generating the mask using the deep learning module to suppress the background pixels.

3. The method as claimed in claim 1, further comprising generating one mask for each axial, sagittal and coronal orientations.

4. The method as claimed in claim 1, wherein the suppressed background pixels are recovered later for image reconstruction and visualization.

5. The method as claimed in claim 1, wherein processing the foreground pixels comprises performing morphological operations on the mask to recover any potential loss of anatomical regions.

6. The method as claimed in claim 1, wherein the deep learning module comprises an inferencing module adapted to generate the mask.

7. The method as claimed in claim 1, wherein a localizer scanner is adapted to generate localizer images that are processed by the deep learning module.

8. A system for acquiring and processing an image in a medical device, the system comprising:

an image acquisition system of the medical device configured to acquire magnetic resonance images of a subject;

an image reconstruction module connected to the image acquisition system and configured to receive magnetic resonance images from the image acquisition system;

a deep learning module connected to the image reconstruction system and adapted to generate a mask; and a visualization module operatively coupled to the image reconstruction model and configured to further process the magnetic resonance images to generate display quality magnetic resonance images;

wherein the deep learning module is configured to identify and differentiate the background pixels from the foreground pixels in the magnetic resonance images, and the image reconstruction module is adapted to use this information during early stages of reconstruction to suppress background pixels using a mask that sets values of only the background pixels to zero and process only foreground pixels during subsequent steps of an image reconstruction pipeline for storage and post processing, wherein the foreground pixels correspond to an anatomical region of the subject and the background pixels correspond to a non-anatomical and clinically irrelevant region located outside the anatomical region, and wherein a fully reconstructed or DICOM image of a localizer is used to generate the mask and the mask is used for suppressing the background pixels in the localizer as well as diagnostic quality images reconstructed from magnetic resonance imaging data acquired in subsequent scans.

9. The system as claimed in claim 8, wherein the deep learning module comprises an inferencing module and generates the mask.

10. The system as claimed in claim 8, wherein the visualization module comprises a display screen configured to show background suppressed visuals of the subject.

11. The system as claimed in claim 8, wherein the deep learning module is a Convolutional Neural Network employing U-Net.

12. The system as claimed in claim 8, wherein the deep learning module comprises an inferencing module and a binary mask adapted to suppress the background pixels.

13. The system as claimed in claim 8, wherein the mask is stored.

\* \* \* \* \*